United States Patent
Huang et al.

[19]

[11] Patent Number: 6,127,262
[45] Date of Patent: Oct. 3, 2000

[54] METHOD AND APPARATUS FOR DEPOSITING AN ETCH STOP LAYER

[75] Inventors: Judy H. Huang, Los Gatos; Wai-Fan Yau, Mountain View; David Cheung, Foster City; Chan-Lon Yang, Los Gatos, all of Calif.

[73] Assignee: Applied Materials, Inc., Santa Clara, Calif.

[21] Appl. No.: 08/852,787

[22] Filed: May 7, 1997

Related U.S. Application Data

[63] Continuation-in-part of application No. 08/672,888, Jun. 28, 1996.

[51] Int. Cl.[7] .................................................. H01L 21/316
[52] U.S. Cl. .......................... 438/634; 438/695; 438/694; 438/680; 438/709; 438/761
[58] Field of Search ....................................... 438/761, 634, 438/680, 694, 695, 709

[56] References Cited

U.S. PATENT DOCUMENTS

| | | |
|---|---|---|
| 3,990,100 | 11/1976 | Mamine et al. . |
| 4,257,832 | 3/1981 | Schwabe et al. . |
| 4,283,249 | 8/1981 | Ephrath . |
| 4,306,353 | 12/1981 | Jacobs et al. . |
| 4,468,413 | 8/1984 | Bachmann . |
| 4,634,496 | 1/1987 | Mase et al. . |
| 4,791,073 | 12/1988 | Nagy et al. . |
| 4,849,366 | 7/1989 | Hsu et al. . |
| 4,910,122 | 3/1990 | Arnold et al. . |
| 4,946,550 | 8/1990 | Van Laarhoven . |
| 4,992,306 | 2/1991 | Hochberg et al. . |
| 5,068,124 | 11/1991 | Batey et al. . |
| 5,204,288 | 4/1993 | Marks et al. . |
| 5,286,667 | 2/1994 | Lin et al. . |
| 5,288,527 | 2/1994 | Jousse et al. . |
| 5,330,883 | 7/1994 | Garza . |
| 5,399,507 | 3/1995 | Sun . |
| 5,418,019 | 5/1995 | Chen et al. . |
| 5,436,463 | 7/1995 | Rostoker . |
| 5,482,894 | 1/1996 | Havemann . |
| 5,500,279 | 3/1996 | Walter et al. . |
| 5,532,191 | 7/1996 | Nakano et al. . |
| 5,710,067 | 1/1998 | Foote et al. ............................. 437/238 |

FOREIGN PATENT DOCUMENTS

| | | |
|---|---|---|
| 0 588 087 A2 | 3/1994 | European Pat. Off. . |
| 1-18/239 | 7/1989 | Japan . |
| 6-240459 | 8/1994 | Japan . |
| 7-201825 | 8/1995 | Japan . |
| 7-201716 | 8/1996 | Japan . |

OTHER PUBLICATIONS

S. Rahman, "The Effect of Helium Dilution On PECVD Silicon Dioxide," *J. Fiz. MaL.*, vol. 10, No. 20 (Mar. 1989).

Ogawa, Tohru et al., "SiOxNy:H, High Performance Anti–Reflective Layer for the Current and Future Optical Lithography," SPIE 1994, vol. 2197, pp. 722–732.

*Primary Examiner*—Charles Bowers
*Assistant Examiner*—Lisa Kilday
*Attorney, Agent, or Firm*—Townsend & Townsend & Crew

[57] ABSTRACT

A method and apparatus for depositing an etch stop layer. The method begins by introducing process gases into a processing chamber in which a substrate is disposed. An etch stop layer is then deposited over the substrate. An overlying layer is then deposited over the etch stop layer. The etch stop layer substantially protects underlying materials from the etchants used in patterning the overlying layer. Moreover, the etch stop layer also possesses advantageous optical characteristics, making it suitable for use as an antireflective coating in the patterning of layers underlying the etch stop layer.

22 Claims, 10 Drawing Sheets

METHOD AND APPARATUS FOR DEPOSITING AN ETCH STOP LAYER

CROSS-REFERENCE TO RELATED APPLICATIONS

This application is a continuation-in-part of patent application Ser. No. 08/672,888, Jun. 28, 1996, entitled "METHOD AND APPARATUS FOR DEPOSITING ANTI-REFLECTIVE COATING," having David Cheung, Joe Feng, Judy H. Huang, and Wai-Fan Yau as inventors; and is related to Application No 16301-015100/AMAT-1530 entitled "IN SITU DEPOSITION OF A DIELECTRIC OXIDE LAYER AND ANTI-REFLECTIVE COATING," having David Cheung, Judy H. Huang, and Wai-Fan Yau as inventors, and Application No 16301-016100/AMAT-1694 entitled "METHOD AND APPARATUS FOR APPLYING AN ANTIREFLECTIVE COATING USING REDUCED DEPOSITION RATES," having David Cheung, Wai-Fan Yau, Joe Feng, Judy H. Huang, and Madhu Deshpande as inventors. All of these applications are assigned to Applied Materials, Inc., the assignee of the present invention, and are hereby incorporated by reference.

BACKGROUND OF THE INVENTION

The present invention relates to an apparatus for, and the processing of, semiconductor substrates. In particular, the invention relates to the patterning of thin films during substrate processing.

Since semiconductor devices were first introduced several decades ago, device geometries have decreased dramatically in size. During that time, integrated circuits have generally followed the two year/half-size rule (often called "Moore's Law"), meaning that the number of devices which will fit on a chip doubles every two years. Today's semiconductor fabrication plants routinely produce devices with feature sizes of 0.5 microns or even 0.35 microns, and tomorrow's plants will be producing devices with even smaller feature sizes.

A common step in the fabrication of such devices is the formation of a patterned thin film on a substrate. These films are often formed by etching away portions of a deposited blanket layer. Modern substrate processing systems employ photolithographic techniques to pattern layers. Typically, conventional photolithographic techniques first deposit photoresist or other light-sensitive material over the layer being processed. A photomask (also known simply as a mask) having transparent and opaque regions which embody the desired pattern is then positioned over the photoresist. When the mask is exposed to light, the transparent portions allow for the exposure of the photoresist in those regions, but not in the regions where the mask is opaque. The light causes a chemical reaction in exposed portions of the photoresist. A suitable chemical, chemical vapor or ion bombardment process is then used to selectively attack either the reacted or unreacted portions of the photoresist. With the remaining photoresist pattern acting as a mask, the underlying layer may then undergo further processing. For example, the layer may be doped or etched, or other processing carried out.

When patterning such thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5 percent of the dimensions specified by the designer.

Modern photolithographic techniques often involve the use of equipment known as steppers, which are used to mask and expose photoresist layers. Steppers often use monochromatic (single-wavelength) light, enabling them to produce the detailed patterns required in the fabrication of fine geometry devices. As a substrate is processed, however, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the mask pattern transferred to the photoresist layer, thereby altering the desired dimensions of the structures subsequently fabricated.

One phenomenon which may result from these reflections is known as standing waves. When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at longer wavelengths because the surfaces of certain materials (e.g., oxide, nitride and polysilicon) tend to be more reflective at deep UV wavelengths. The existence of standing waves in the photoresist layer during exposure causes roughness in the vertical walls formed when sections of the photoresist layer are removed during patterning, which translates into variations in linewidths, spacing and other critical dimensions.

One technique helpful in achieving the necessary dimensional accuracy is the use of an antireflective coating (ARC). An ARC's optical characteristics are such that reflections occurring at inter-layer interfaces are minimized. The ARC's absorptive index is such that the amount of monochromatic light transmitted (in either direction) is minimized, thus attenuating both transmitted incident light and reflections thereof. The ARC's refractive and reflective indexes are fixed at values that cause any reflections which might still occur to be canceled.

Another phenomenon encountered in photolithography is variation in the reactivity of deposited materials with respect to the etchants used in etching a given layer. A material's reactivity with respect to another material when using a given etchant is known as the material's etch selectivity. Etch selectivity is usually denoted by a ratio of the etch rate of the material to be removed to that of the other material. A high etch selectivity is therefore often desirable because, ideally, an etchant should selectively etch only the intended areas of the layer being patterned and not erode other structures which might already exist on the substrate being processed. In other words, a material with high etch selectivity substantially resists etching during the etching of another material.

For example, high etch selectivity of a first layer with respect to a second, overlying layer is desirable when the first layer should not be etched during the patterning of the second layer, such as during the patterning of the second of two dielectric layers. High etch selectivity is desirable in such situations because the underlying layer will not be significantly eroded in areas where the second layer is completely etched away. If the first layer's etch selectivity is low, the etching operation removes not only the intended regions of the second layer, but portions of the first layer underlying those regions as well, possibly destroying the first layer's topology. While the removal of a small amount of the first layer may be expected in such situations, extremely low etch selectivity may allow the first layer to be etched away substantially, possibly rendering the affected structures inoperable.

High etch selectivity is desirable in many situations. Examples include processes for creating vias, self-aligned contacts and local interconnect structures. For example, the damascene process sometimes used in creating connections between metal layers can benefit from a layer having high etch selectivity. Damascene is a jewelry fabrication term that has been adopted in the processing of substrates to refer to a metallization process in which interconnect lines are recessed in a planar dielectric layer by patterning troughs in the dielectric layer and then filling the troughs with metal by blanketing the dielectric layer's surface with a layer of metal. Excess metal (i.e., that metal not filling the troughs) is then removed by chemical-mechanical polishing (CMP) or similar method. This is in contrast to traditional processes used to create metal interconnect lines, which usually proceed by forming metal interconnect lines over a dielectric layer and subsequently blanketing the entire structure with one or more layers of dielectric material.

One advantage of a damascene process is that the resulting surface is more planar than those surfaces created by traditional processes. Another advantage is the elimination of an etching step when defining the metal pattern. This increases the flexibility in the choice of metal composition. Dry etching of aluminum-copper alloys, for example, becomes more difficult as the copper content increases. When no etching is required, a larger amount of copper or other elements can be added to the alloy, thereby improving the metal's immunity to electromigration.

It is therefore desirable to provide a structure which avoids unwanted etching of layers underlying the layer being patterned. Additionally, the photolithography process would benefit from a technique by which such patterning might be done more accurately, such as by the use of an ARC layer. Specifically, such a layer should allow the use of a process such as the damascene process, while providing the optical qualities necessary to providing acceptable patterning accuracy.

SUMMARY OF THE INVENTION

The present invention solves the above problems of the prior art by providing a method and apparatus for depositing an etch stop layer for protecting layers formed beneath the etch stop layer during the patterning of layers formed above the etch stop layer. Moreover, the etch stop layer also possesses advantageous optical characteristics, making it suitable for use as an antireflective coating in the patterning of layers underlying the etch stop layer.

According to the method of the present invention, a process is provided for depositing a multilayer structure over a substrate disposed in a processing chamber. The process begins by forming a first layer over the substrate. Next, a second layer is deposited over the first layer and a third layer is formed over the second layer. The third layer, which is photosensitive, is then exposed to incident radiant energy. A first portion of the incident radiant energy is reflected from an upper surface of the first layer and a second portion of the incident radiant energy is reflected from a lower surface of the first layer. The second layer causes the second portion of the incident radiant energy to be an odd multiple of about 180° out of phase with the first portion of the incident radiant energy. This causes the first and second portions of the incident radiant energy to at least partially cancel each other. Preferably, the second layer causes the first and second portions of the incident radiant energy to be substantially similar in intensity. Additionally, the second layer substantially protects the first layer from exposure to an etchant used to etch a fourth layer, deposited over the second layer, by virtue of possessing a high etch selectivity with respect to the fourth layer with respect to the etchant.

A further understanding of the nature and advantages of the present invention may be realized by reference to the remaining portions of the specification and the drawings.

DETAILED DESCRIPTION OF THE PREFERRED EMBODIMENTS

I. Introduction

In a preferred embodiment of the present invention, an antireflective coating (ARC) is deposited to protect layers underlying the ARC from etchants used to pattern layers overlying the ARC, and to promote more accurate patterning of the layer underlying the ARC by reducing the reflection and refraction of incident light within a photoresist layer used in the patterning operation. According to the method of the present invention, the ARC preferably includes silicon, nitrogen and oxygen. An ARC having this kind of composition is referred to herein as a dielectric ARC (DARC), as distinguished from a more traditional ARC, which is normally organic in composition. According to the present invention, a DARC may be deposited on a substrate using a plasma-enhanced chemical vapor deposition (PECVD) technique. To deposit the DARC, a chemical reaction is promoted between silane ($SiH_4$) and nitrous oxide ($N_2O$), in the presence of helium (He) and, optionally, a nitrogen-containing compound (e.g., ammonia ($NH_3$)), substantially adjacent to the substrate's surface. While these process gases are preferred, they are by no means the only combination which may be used in the method of the present invention. For example, other silicon-containing compounds, such as tetraethoxysilane (TEOS) and others, and other oxygen sources such as oxygen ($O_2$), ozone ($O_3$) and others, and other sources of nitrogen, may also be employed, although different processing conditions may be required.

II. An Exemplary CVD System

Figure 1A:
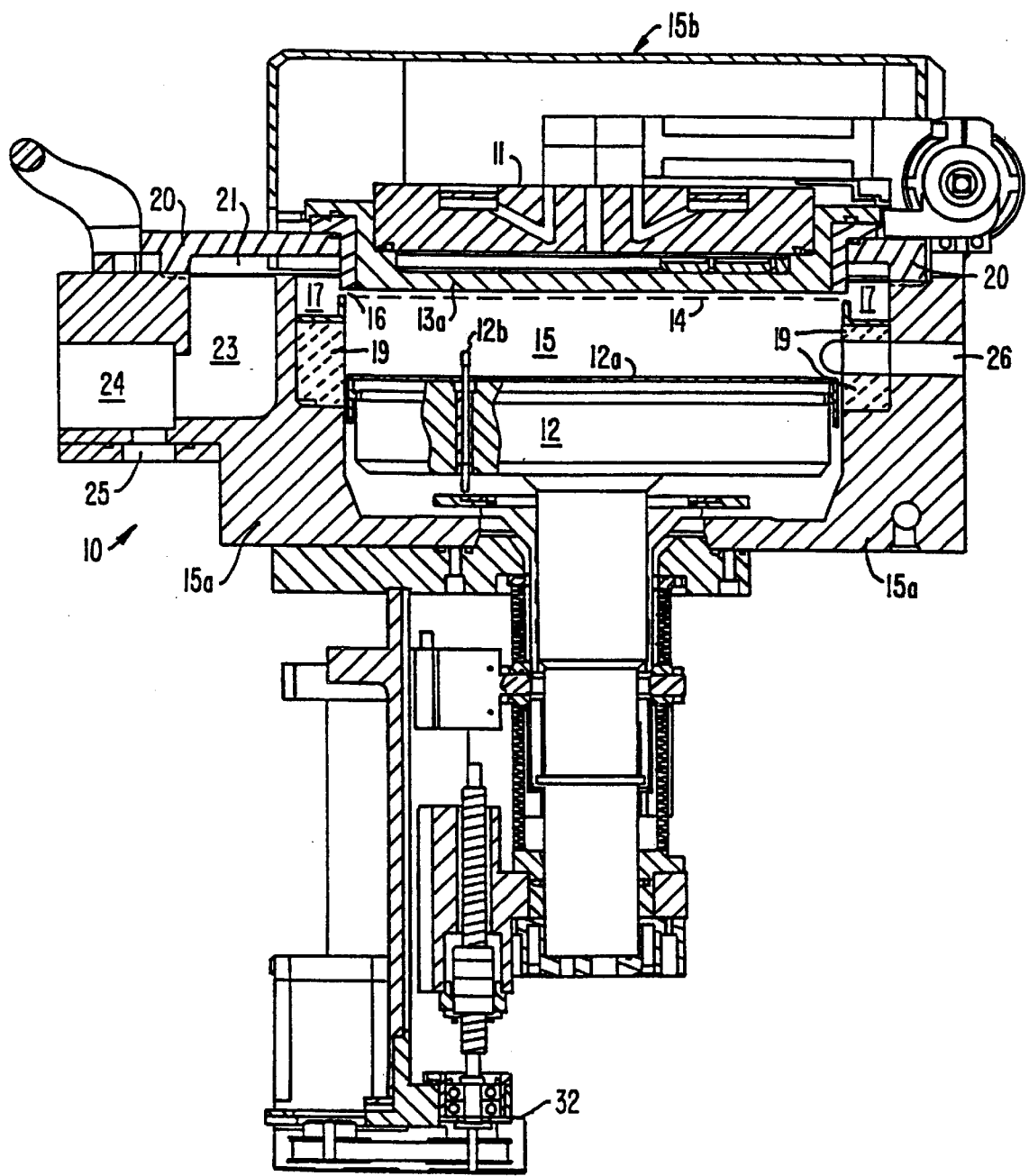
FIGS. 1A and 1B are vertical, cross-sectional views of one embodiment of a chemical vapor deposition apparatus according to the present invention.
Figure 1B:
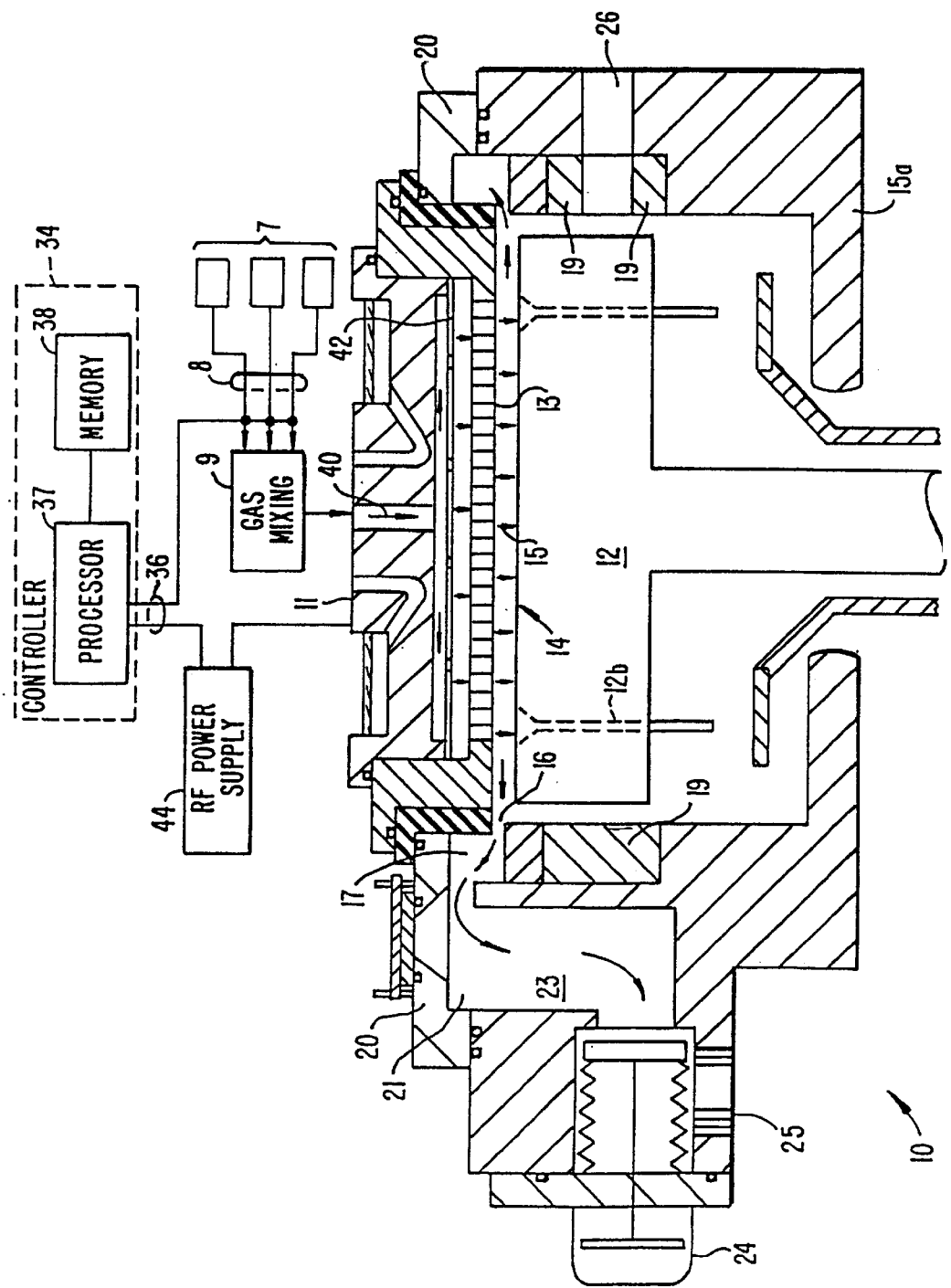
Figure 1C:
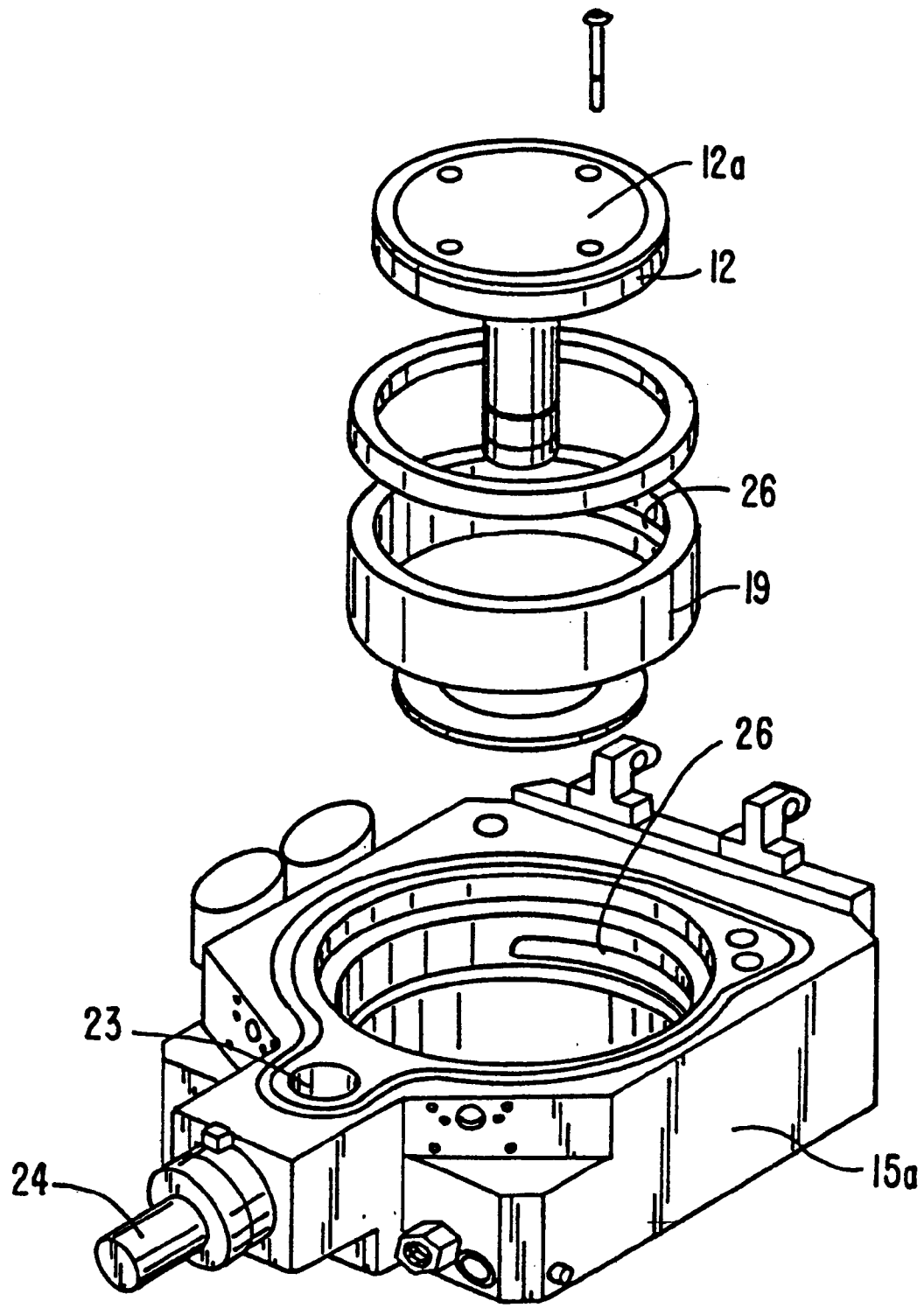
FIGS. 1C and 1D are exploded perspective views of parts of the CVD chamber depicted in FIG. 1A.
Figure 1D:
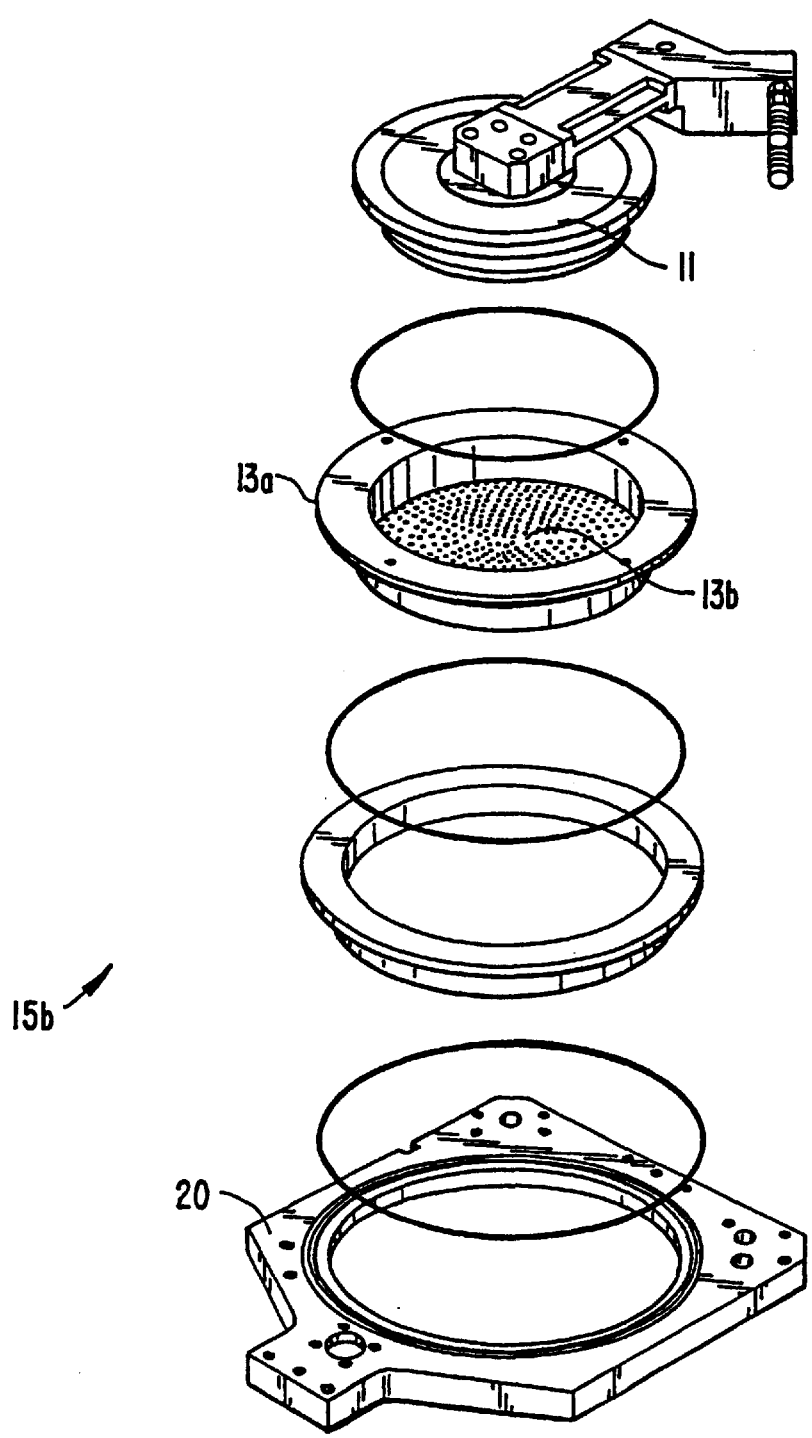

One suitable CVD apparatus in which the method of the present invention can be carried out is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a heated pedestal 12 centered within the process chamber. During processing, the substrate (e.g., a semiconductor wafer) is positioned on a flat (or slightly convex) surface 12a of pedestal 12. The pedestal can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution face plate 13a. More specifically, deposition process gases flow into the chamber through the inlet manifold 11 (indicated by arrow 40 in FIG. 1B), through a conventional perforated blocker plate 42 and then through holes 13b in gas distribution faceplate 13a.

Before reaching the manifold, deposition and carrier gases are input from gas sources 7 through gas supply lines 8 (FIG. 1B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma enhanced process. In a plasma enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15.

During a deposition process, the plasma heats the entire process chamber 10, including the walls of the chamber body 15a surrounding the exhaust passageway 23 and the shut-off valve 24. When the plasma is not turned on, a hot liquid is circulated through the walls 15a of the process chamber to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum) is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum or anodized aluminum. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 32 (FIG. 1A) raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and susceptor which are moved by appropriate motors under the control of controller 34. code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1E:
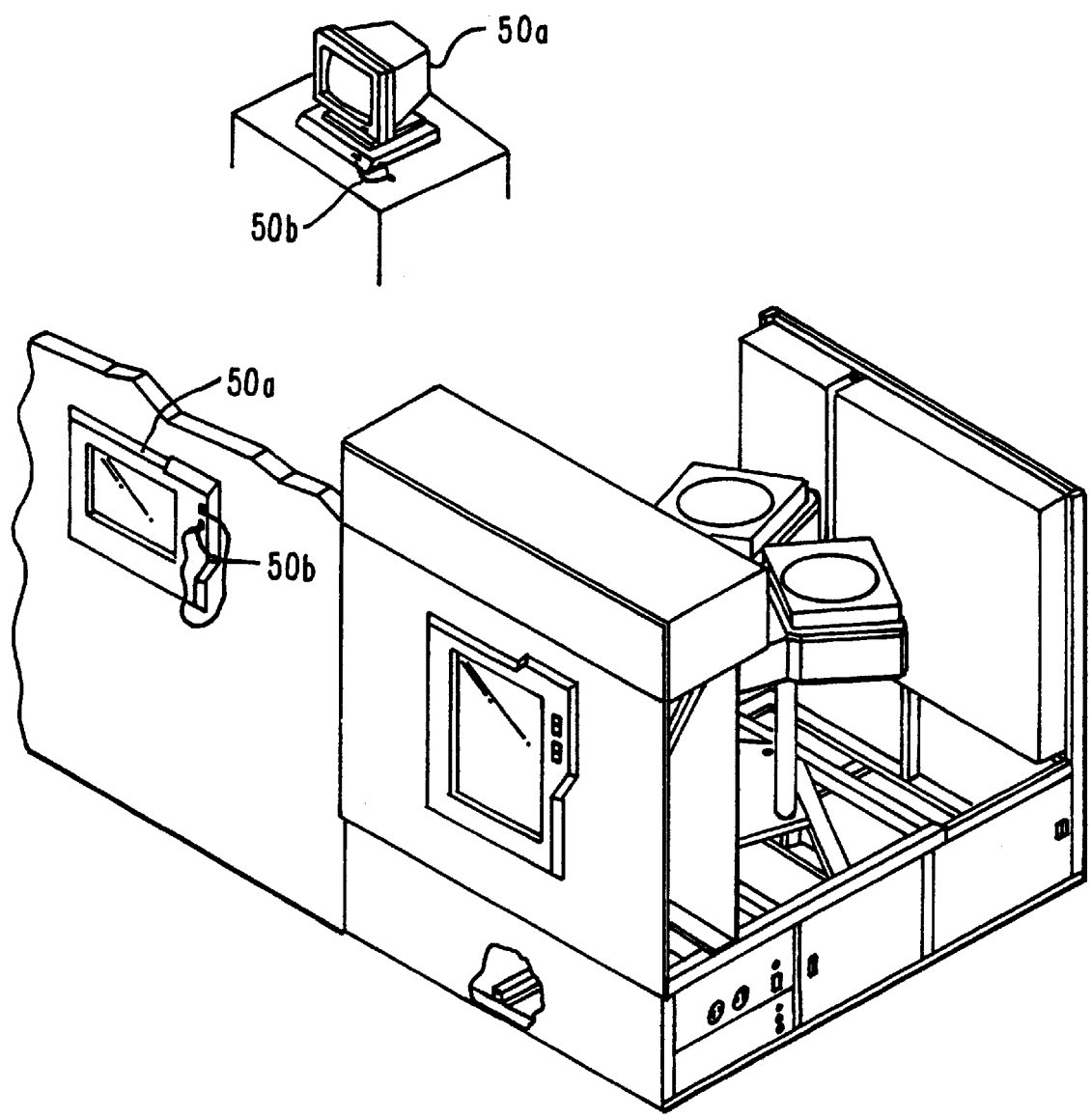
FIG. 1E is a simplified diagram of system monitor and CVD system 10 in a multichamber system.
Figure 1F:
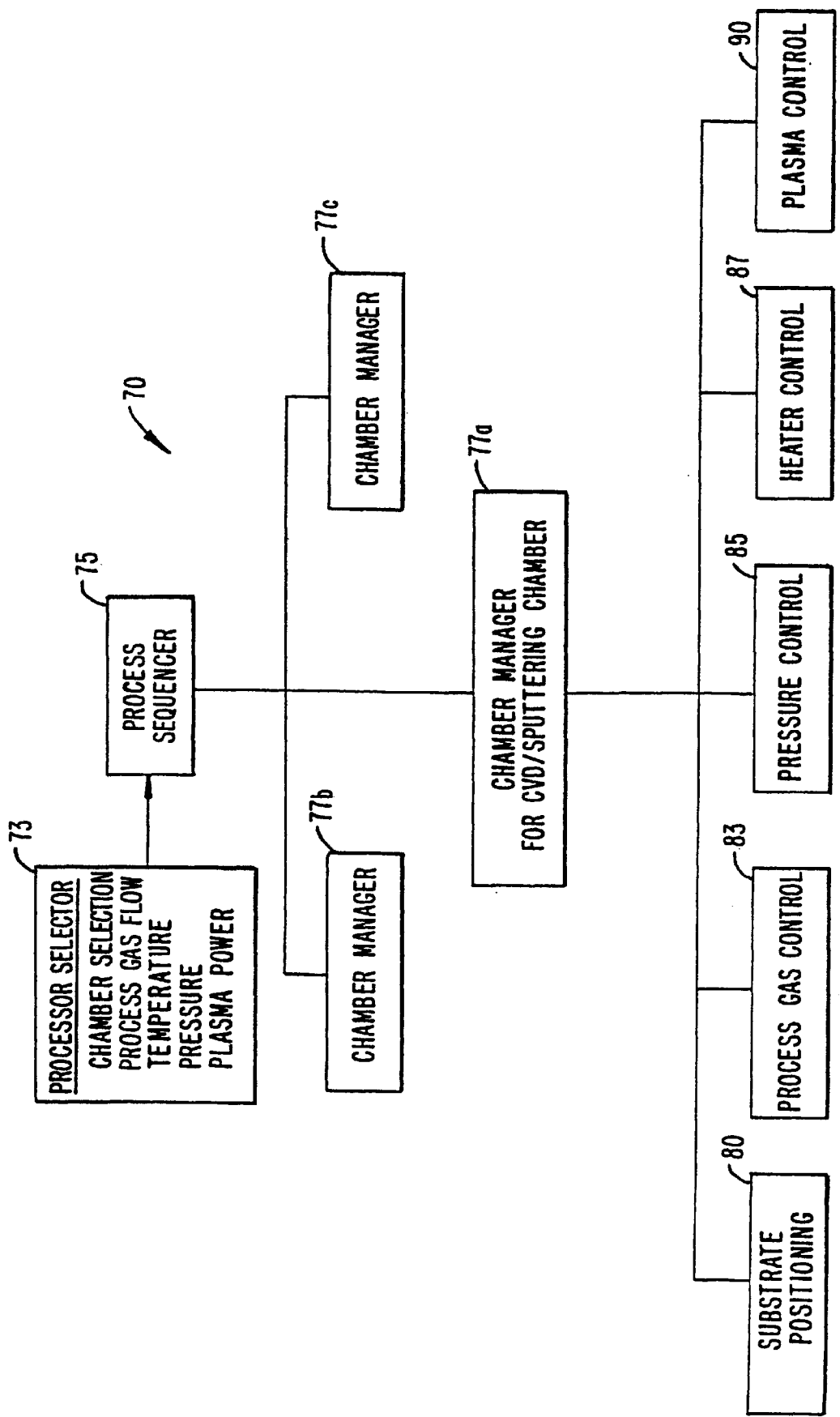
FIG. 1F shows an illustrative block diagram of the hierarchical control structure of the system control software, computer program 70, according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber andc type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto the susceptor 12 and, optionally, to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, tetraethylorthosilane ("TEOS"), the process gas control subroutine 83 is written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure nanometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a susceptor 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the susceptor 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in susceptor design, heater design, RF power frequencies, location of RF power connections and others are possible. For example, the wafer could be supported and heated by quartz lamps. The film of the present invention, and method for forming the same is not limited to any specific apparatus or to any specific plasma excitation method. Moreover, the deposition rate of films other than silicon nitride and silicon oxynitride films may also be controlled when using the method of the present invention.

III. Deposition of an Etch Stop Layer Having Beneficial Optical Characteristics

Using a substrate processing apparatus such as the exemplary CVD system described above, an etch stop layer may be deposited according to the present invention. This yields an etch stop layer (ESL) capable of protecting underlying layers during the patterning of overlying layers. Moreover, an ESL formed according to the method of the present invention also possesses advantageous optical characteristics, making it suitable for use as a DARC in the patterning of layers underlying the ESL. Thus, this layer is referred to herein as a DARC/ESL.

Figure 2:
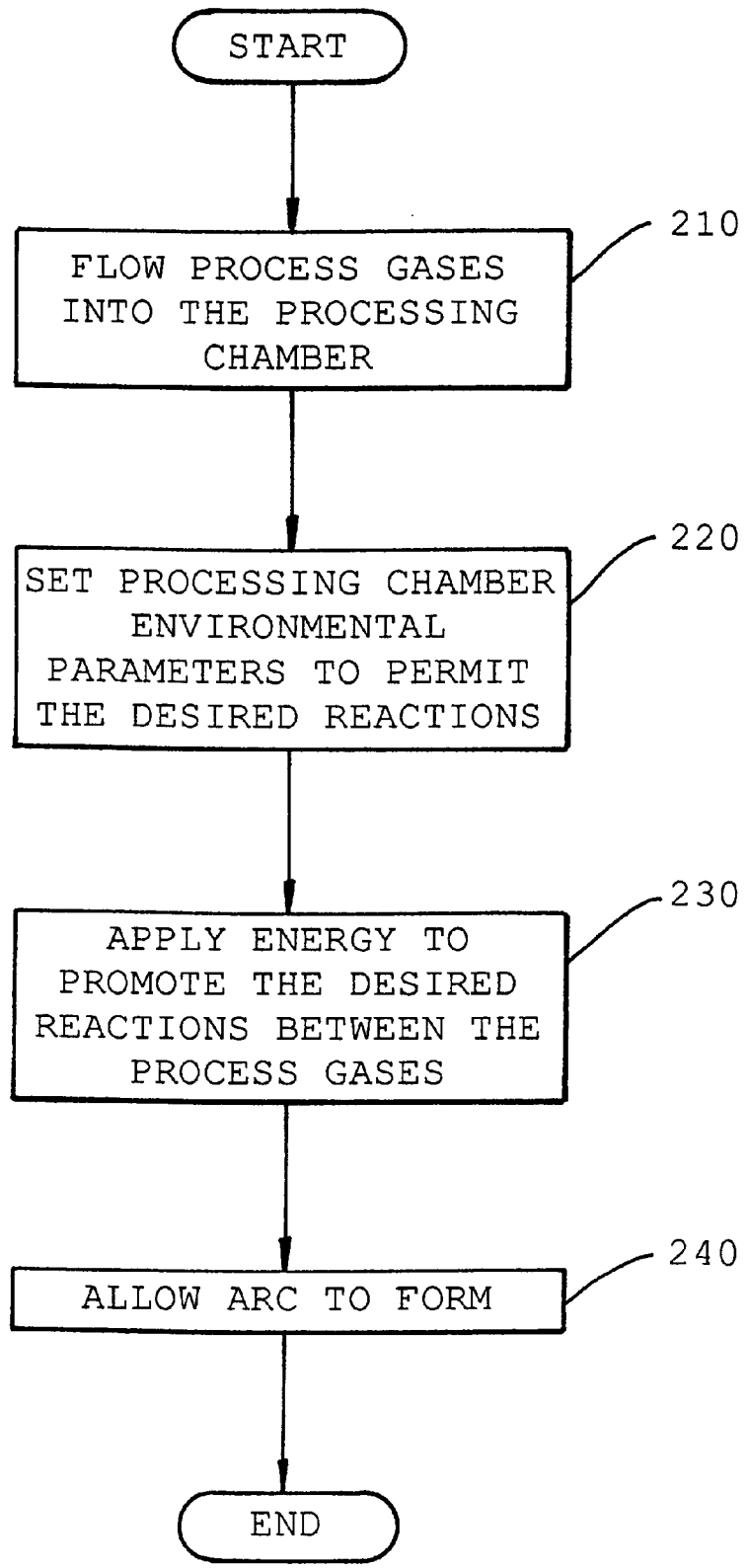
FIG. 2 is a flow diagram for a process of depositing a DARC/etch stop layer according to the method of the present invention.

FIG. 2 is a flow diagram illustrating the steps performed in depositing a DARC/ESL according to one embodiment of the present invention. The flow diagram is described in terms of the exemplary PECVD system shown in FIG. 1A.

The process deposits a DARC/ESL over the upper surface of a substrate positioned in processing chamber 15. At step 210, the process gases used to deposit the DARC/ESL are introduced into processing chamber 15 via manifold 11. These process gases preferably include silane and nitrous oxide. Silane may be introduced into processing chamber 15 at a rate of between about 5 sccm and 300 sccm. Nitrous oxide may be introduced into processing chamber 15 at a rate of between about 5 sccm and 300 sccm. The ratio of silane to nitrous oxide may be varied between about 0.5:1 and 3:1, but is preferably about 1:1. Helium may be introduced into processing chamber 15 at a rate of between about 5 sccm and 5000 sccm.

Ammonia or other nitrogen-containing compound may also be introduced into processing chamber 15, depending on the values of refractive index, absorptive index, and thickness desired, and the process regime used. If wider ranges of refractive indices, absorptive indices, and thicknesses are desired, ammonia may be introduced into the chamber at a rate of 0–300 sccm. Optionally, these wider ranges may be achieved by increasing the helium flow rate within the limits previously mentioned. Within these ranges, the preferred range for introducing silane is 15–160 sccm; for nitrous oxide, the preferred range is 15–160 sccm; for ammonia, the preferred range is 0–300 sccm; and for helium, the preferred range is 500–4000 sccm. The optimal flow rates for these gases are: silane, 40–120 sccm; nitrous oxide, 30–120 sccm; helium, 1500–2500 sccm; and ammonia, 0–150 sccm.

Environmental parameters within the chamber are then set to the proper levels at step 220. Pressure in processing chamber 15 is maintained at between about 1.0 torr and 7.0 torr as the process gases are introduced. Substrate temperature is maintained at between about 200° C. and 400° C. The spacing between pedestal 12 and face plate 13a is set in the range of 200–600 mil. DARC/ESLs with varying refractive index, absorptive index, and thickness can be deposited using these process parameters for any exposure wavelengths between about 190 nm and 900 nm. Within these ranges, the preferred range for face plate spacing is between about 400 mil and 600 mil. The preferred ranges for substrate temperature and chamber pressure are 300–400° C. and 4.5–6.0 torr, respectively.

At step 230, RF power supply 44 supplies RF energy to processing chamber 15, thereby forming a controlled plasma from the process gases adjacent to the substrate and depositing the DARC. RF power supply 44 may supply RF power to manifold 11 (and thus to face plate 13a) at between about 50 W and 500 W. The aforementioned conditions are maintained during the deposition of the DARC at step 240.

The process parameters and gas introduction rates described herein are representative values for a resistively-heated Centura DxZ Chamber manufactured by Applied Materials, Inc., outfitted to process 8-inch substrates. The process described is not intended to limit the method of the present invention. Other chamber sizes or chambers made by other manufacturers may have different values. As previously noted, other reactants (e.g., TEOS) and parameters (e.g., different flow rates, chamber pressures or substrate temperatures) may be used to deposit a dielectric/DARC structure of the type described herein.

A DARC/ESL fabricated according to the process of the present invention provides several benefits. First, such a DARC/ESL is capable of improving accuracy in lithographic processes, as previously described. Additionally, unlike ARCs (e.g., the organic ARCs used in some processes), a DARC/ESL according to the present invention may serve as an etch stop layer to protect underlying layers which have low etch selectivity with regard to the overlying layer being etched. For example, a DARC/ESL would preferably exhibit an etch selectivity of about 5:1 when using phosphoric acid ($H_3PO_4$) as an etchant to pattern a dielectric such as silicon oxide. This is known as a film's dielectric etch selectivity, and should be such that the DARC/ESL is able to serve to substantially protect an underlying dielectric layer of similar composition. For example, such a layer could be used in the damascene process described previously.

IV. An Exemplary Structure Employing an DARC/ESL

Figure 3:
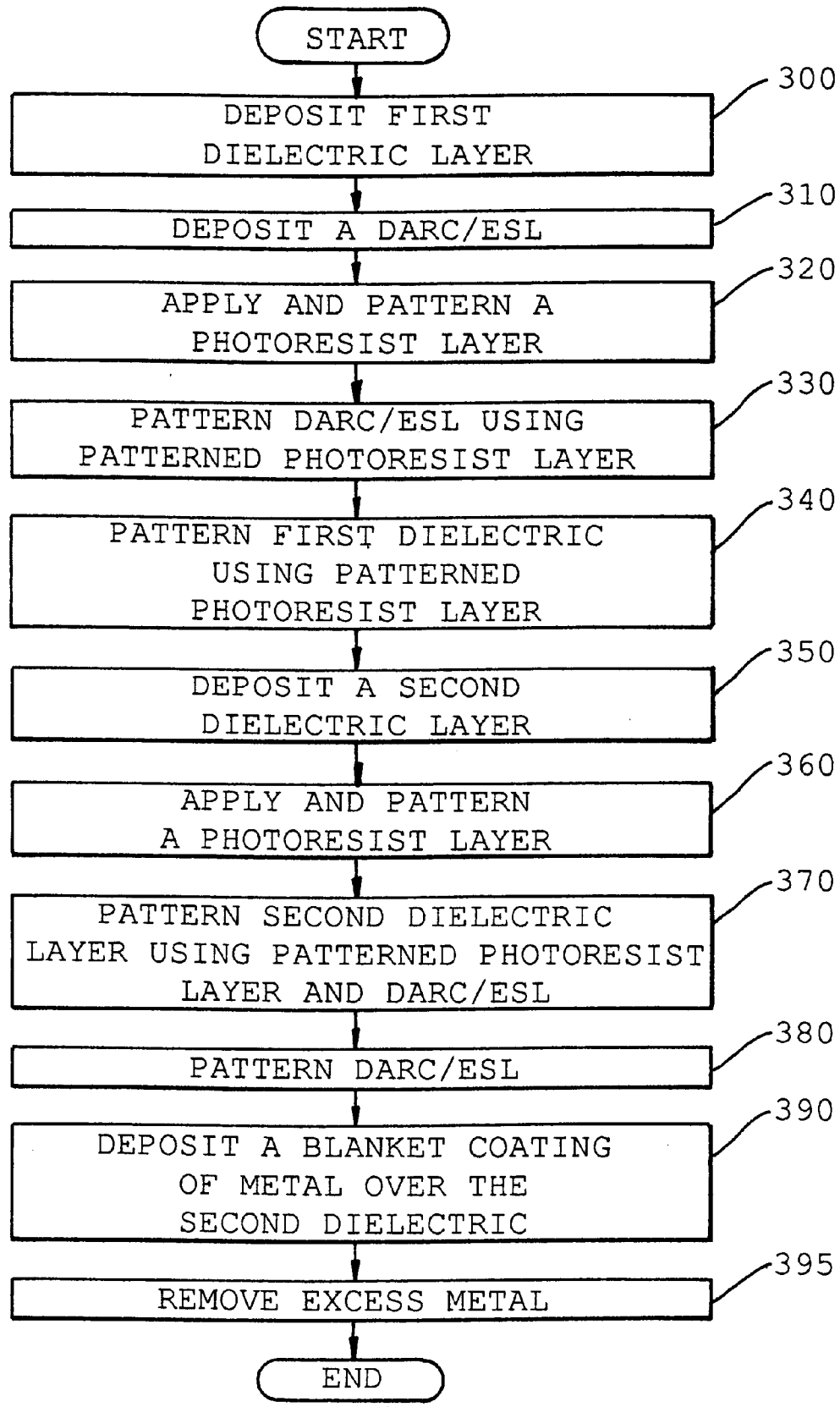
FIG. 3 is a flow diagram for a damascene process employing a DARC/etch stop layer according to the method of the present invention.

FIG. 3 illustrates the steps performed in a damascene process, and is described with reference to the vertical, cross-sectional views of the structure being fabricated during various points in the fabrication process shown in FIGS. 4A–4E. As noted, a damascene technique uses a planarization step to remove excess metal applied in a blanket over a patterned dielectric layer, leaving metal only in the etched areas of the dielectric. Various structures can be fabricated using a damascene process. For example, metal interconnect layers may be fabricated, as may inter-metal dielectric (IMD) layers, which provide connections between metal interconnect layers known as vias. Such structures increase the density, performance, and reliability of devices thus fabricated. A damascene process also permits the use of otherwise unsuitable metal compositions. Additionally, the resulting surface is more planar than those surfaces created by traditional processes.

In this example, a damascene structure is fabricated over a first dielectric layer 400. First dielectric layer 400 is deposited at step 300. A DARC/ESL 410 is then deposited over first dielectric layer 400 at step 310 using an appropriate deposition method, such as the PECVD process described previously. These layers can be seen in the structure shown in FIG. 4A.

Optionally, first dielectric layer 400 may be patterned, with DARC/ESL 410 acting as an antireflective coating to improve patterning accuracy. First, a photoresist layer is applied and patterned using a mask, thus forming a patterned photoresist layer (not shown) at step 320. The pattern is transferred to DARC/ESL 410 by an etching operation (step 330). This etching operation employs an etchant particularly suited to etching DARC/ESL material (e.g., silicon nitride or silicon oxynitride). At step 340, first dielectric layer 400 is also patterned by an etching operation. The photoresist layer is then removed. Alternatively, the photoresist layer may be removed prior to patterning first dielectric layer 400, and DARC/ESL 410 used as the masking layer during the patterning operation. However, if DARC/ESL 410 is to be used as a mask, DARC/ESL 410 will likely have to be deposited in greater thicknesses than might otherwise be required.

Aside from its use as an etch stop layer in later processing steps, DARC/ESL 410 also provides improved accuracy in the patterning of the photoresist layer. By reducing reflection and refraction of the incident radiant energy used to expose the photoresist layer, DARC/ESL 410 reduces the unintentional exposure of photoresist material. DARC/ESL 410 is thus capable of acting as both an antireflective coating and an etch stop layer.

Figure 4A:
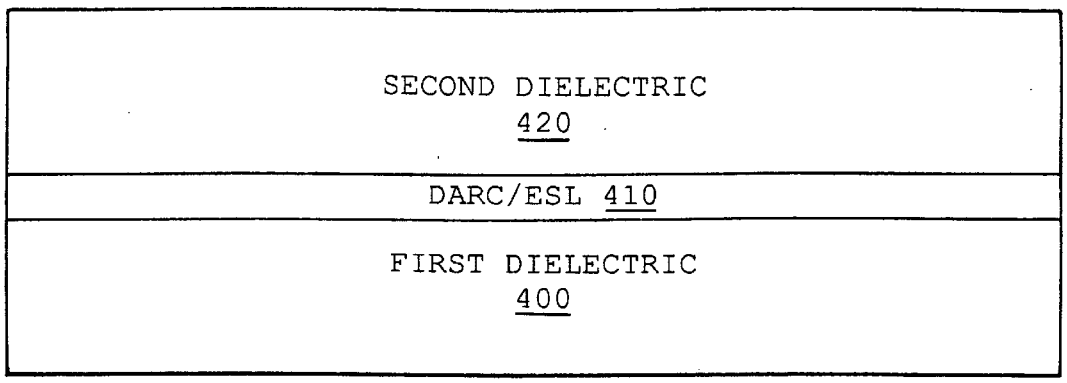
FIGS. 4A–4E are simplified cross-sectional views of a damascene structure at various points in the process described by the flow diagram of FIG. 3.

The damascene process, per se, actually begins with the deposition of DARC/ESL 410. The next step in the damascene process occurs at step 350, where a second dielectric layer 420 is deposited. First dielectric layer 410, DARC/ESL 410 and second dielectric layer 420 are shown in FIG. 4A after the optional patterning of first dielectric layer 410 has been completed (steps 330 and 340) and the photoresist layer removed. FIG. 4A does not illustrate the effects of the optional patterning process on first dielectric layer 400 for reasons of simplicity and therefore simply shows these layers as originally deposited.

The deposition of dielectric layer 420 is followed by the application and patterning of photoresist material (using a mask pattern) to form a patterned photoresist layer (not shown) at step 360. The pattern etched into this photoresist layer is then transferred to second dielectric layer 420 by an etching operation (step 370). The result of this operation can be seen in FIG. 4B, in which gaps 430 and 440 serve to exemplify the pattern etched into second dielectric layer 420.

Figure 4B:
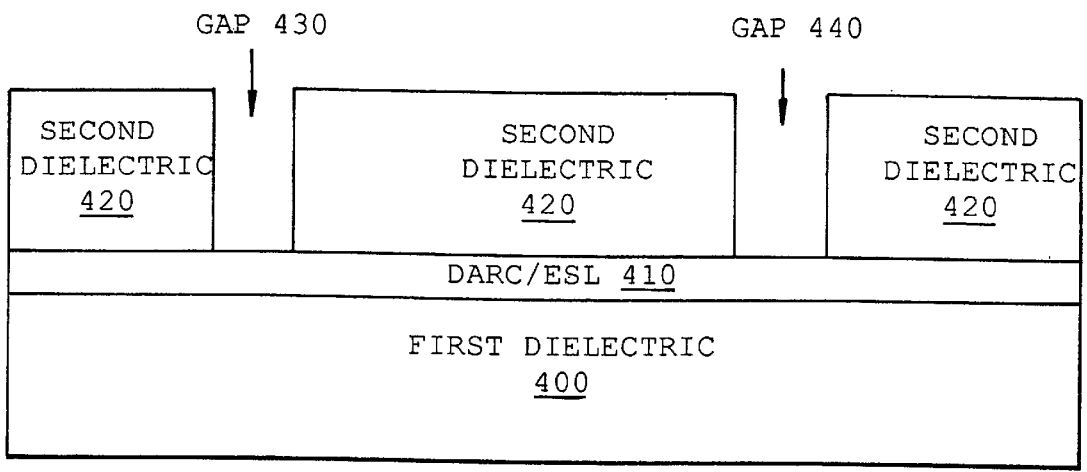

This etching operation employs an etchant particularly suited to etching only the dielectric material employed (e.g., silicon oxide), leaving DARC/ESL 410 substantially unaffected. DARC/ESL 410 thus serves to protect first dielectric layer 400 from such etchants. This is important because first dielectric layer 400 is likely to be as susceptible to these etchants as is second dielectric layer 420. This is illustrated in FIG. 4B, which shows DARC/ESL 410 as having not been appreciably affected. In actual implementation, DARC/ESL 410 may need to offer only substantial protection to first dielectric layer 400 (as opposed to complete protection thereof). In other words, some etching of first dielectric layer 400 may occur without adversely affecting the circuitry being fabricated.

Figure 4C:
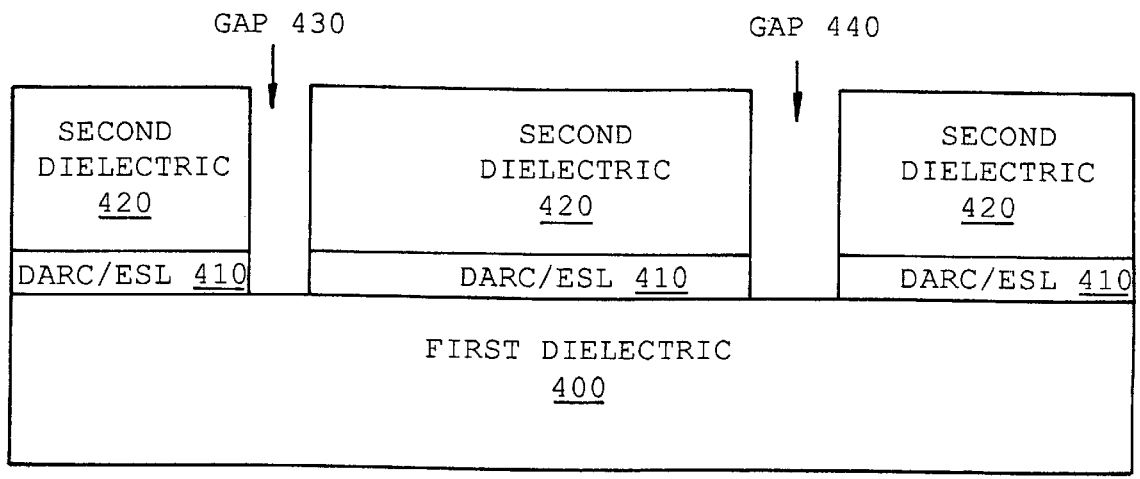

Optionally, the portions of DARC/ESL 410 exposed by the previous patterning operation (e.g., those portions at the bottom of gaps 430 and 440) may also be removed. Such an operation is performed at step 380. The results of this operation are shown in FIG. 4C. Here, the etching operation employs an etchant particularly suited to etching DARC/ESL material (e.g., silicon nitride or silicon oxynitride), thus leaving first dielectric 400 substantially unaffected.

Figure 4D:
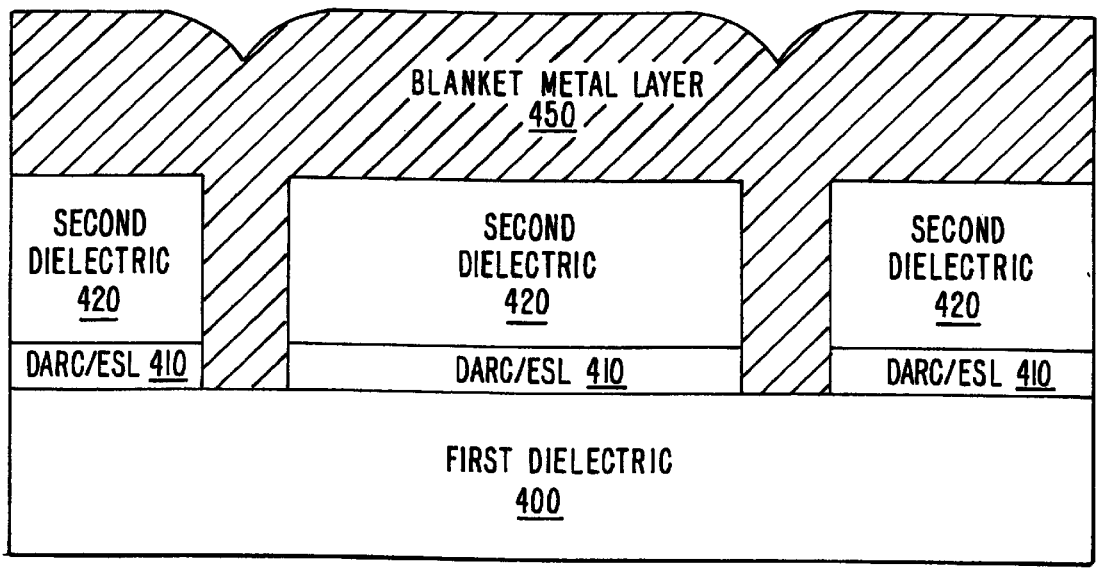

A blanket metal layer 450 is then deposited at step 390, covering the upper surface of second dielectric layer 420 and filling in the pattern etched therein. The results of this deposition are shown in FIG. 4D, which shows gaps 430 and 440 substantially filled by metal. Next, blanket metal layer 450 is planarized by a technique such as chemical-mechanical polishing (CMP) (step 395), which removes excess metal and causes the upper surface of blanket metal layer 450 to become level with the upper surface of second dielectric layer 420, as is apparent in FIG. 4E. This forms discrete portions of metal, corresponding to the pattern etched into second dielectric 420 (and, optionally, DARC/ESL 410), exemplified by metal lines 460 and 470.

Alternatively, planarization may be continued to polish second dielectric layer 420 as well.

The damascene process described herein is made possible by its dual-chemistry nature. Chemically different etching processes are used, depending on whether dielectric or DARC/ESL material is being removed. For example, the etchants used to remove the dielectric material have minimal effects on the DARC/ESL material. Similarly, the etchants used to remove the DARC/ESL material have minimal effects on the dielectric material. This allows, for example, the etching of second dielectric layer 420 while protecting first dielectric layer 400.

VI. Experimental Results

In simulations performed to determine preferable characteristics of DARC/ESLs used in various applications, structures including such a layer were simulated using a Prolitho simulator with Positive/Negative Resist Optical Lithography Model version 4.05a. The Prolitho software was used to simulate the exposure of several different multilayer structures (known as stacks) to deep UV radiant energy having a wavelength of 248 nm. Each of the stacks simulated included a DARC/ESL. Other simulation parameters included an exposure energy of 26 mJ and an exposure time of 80 seconds. The simulated photoresist approximated the characteristics of a layer of APEX E photoresist, 1000 nm (1 $\mu$m) in thickness.

Figure 4E:
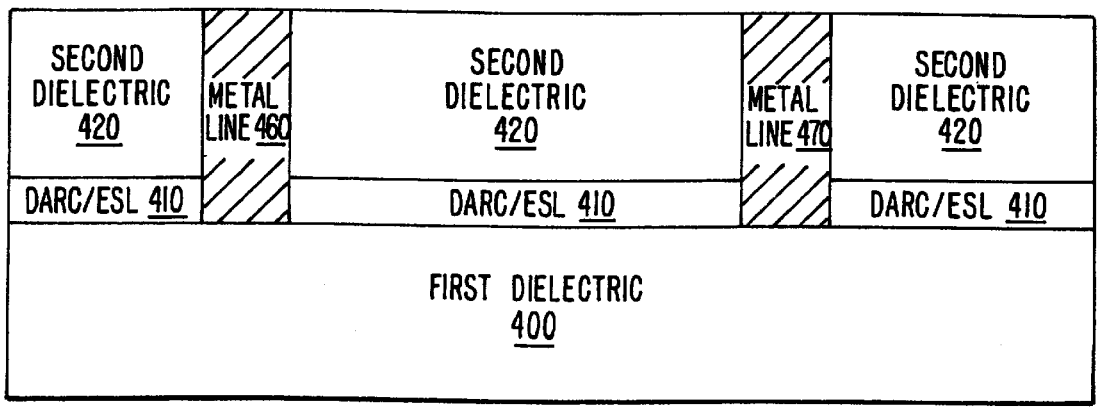

The multilayer structures simulated were analogous to that illustrated in FIG. 4E. Several materials were used as both overlying and underlying layers. The results of these simulations are summarized in Table 1 below (wherein the DARC/ESL is simply referred to as a DARC, for simplicity).

TABLE 1

Preferable Optical Parameters for Simulated DARC/ESLs

| Stack Composition | n (unitless) | k (unitless) | t (in Å) | Exposure Wavelength (nm) |
|---|---|---|---|---|
| DARC/SiN$_x$/SiO$_x$/WSi$_x$/Poly | 2.75 | 0.55 | 310 | 365 |
| DARC/α-Poly/SiO$_x$/WSi$_x$/Poly | 2.64 | 0.44 | 310 | 365 |
| DARC/SiO$_x$/WSi$_x$/Poly | 2.7 | 0.5 | 640 | 365 |
| DARC/Aluminum | 2.83 | 0.9 | 255 | 365 |
| SiO$_x$/DARC/SiO$_x$/Poly | 2.5 | 0.35 | 1000 | 365 |
| DARC/SiO$_x$/SiN$_x$ (Deep Trench Stack) | 2.15 | 0.54 | — | 248 |
| DARC/SiO$_x$/SiN$_x$ (Contact Etch) | 2.15 | 0.54 | — | 248 |
| DARC/TiN/Al | 2.15 | 0.54 | 300 | 248 |

In the simulated structures, oxide layers are represented by silicon oxide (SiO$_x$; also known as undoped silicate glass or USG). Various other oxides may be used in these layers, either alone or in combination, although oxides other than those based on silicon oxide may require different DARC/ESL characteristics to minimize substrate reflectivity. Layers of borosilicate glass (BSG; silicon oxide doped with boron) and borophosphosilicate glass (BPSG; silicon oxide doped with boron and phosphorus) were treated as possessing optical characteristics substantially identical to a USG layer of similar thickness, since the refractive indices of these substances are so similar. Thus, no delineation is made between such layers in the composition of the underlying oxide layer, for purposes of the simulations discussed herein. Layers consisting of a nitride are represented by silicon nitride (SiN$_x$). Again, different nitrides may be used, but may require different DARC/ESL characteristics to minimize substrate reflectivity.

The first stack simulated consisted of a DARC/ESL, silicon nitride, silicon oxide, tungsten silicide (WSi$_x$) and polysilicon layers (listed from top-most layer to bottom-most layer). Substrate reflectivity was found to be sensitive to the thickness of the nitride layer. Optimally, the nitride layer was 150 nm in thickness, yielding a substrate reflectivity approaching 0%. However, for variations of about 33% in nitride layer thickness, the simulation predicted a rise in substrate reflectivity to over 40%. Even for variations in nitride layer thickness of only 10%, substrate reflectivities might be expected to be as much as about 20%. Thus nitride layer thickness is an area of concern when manufacturing such a structure. Greater thicknesses could be used in this particular application, if greater protection of the underlying layer(s) was desired (or required, due to manufacturability limitations).

The second stack simulated consisted of a DARC/ESL, α-polysilicon, silicon oxide, tungsten silicide and polysilicon layers (again listed from top-most layer to bottom-most layer). Substrate reflectivity was found to fall from a high of 40% (at a thickness of 0 nm (i.e., no DARC/ESL)) as the α-polysilicon layer's thickness increased. As the α-polysilicon layer's thickness approached 30 nm (300 Å), the substrate reflectivity went to nearly 0% and remained so after that point (the α-polysilicon layer's thickness was only simulated up to 1000 Å, however). This indicated that once the α-polysilicon layer's thickness was equal to or greater than 300 Å, the layers underlying the α-polysilicon layer could be ignored for purposes of this analysis. Applications for a stack of this type include a dual oxide/nitride structure. Greater thicknesses could also be used in this application, if greater protection of the underlying layer(s) was desired (or required, due to manufacturability limitations).

The third stack simulated consisted of a DARC/ESL, silicon oxide, tungsten silicide and polysilicon layers (again listed from top-most layer to bottom-most layer). Substrate reflectivity was found to vary periodically with the oxide layer's thickness. It was estimated that minimums would be experienced approximately every additional 120 nm, starting at 80 nm (i.e., at 80 nm, 200 nm, 320 nm and so on), although this stack was only simulated for oxide thicknesses of between 100 nm and 300 nm. Variations of up to 10% in the oxide layer's thickness were found to cause increases in substrate reflectivity of less than about 1%.

The fourth stack simulated consisted of a DARC/ESL and an aluminum layer. Because aluminum is impenetrable to the wavelengths of radiant energy used in photolithography processes, the composition of layers underlying the aluminum layer is immaterial to this analysis. As noted in Table 1, simulations indicated an optimal DARC/ESL thickness of 255 Å. Greater thicknesses could also be used in this application, if greater protection of the underlying layer(s) was desired (or required, due to manufacturability limitations).

The fifth stack simulated consisted of a first silicon oxide layer, a DARC/ESL, a second silicon oxide layer and a polysilicon layer (again listed from top-most layer to bottom-most layer). By simulating various first and second silicon oxide layer thicknesses, optimal thickness values of 8400 Å for the first silicon oxide layer and 12350 Å for the second silicon oxide layer were determined. Optimization of these thickness values permitted tuning of the DARC/ESL's characteristics for minimal substrate reflectance and high resistivity (on the order of 9.5×10$^9$Ω). As shown in Table 1, this stack used a DARC/ESL having a thickness of 1000 Å, and n and k values of 2.5 and 0.35, respectively.

Prolitho simulations were also performed to determine optimal optical properties of Deep Trench Stack (DTS; the sixth layer simulated) and Contact Etch Stack (CES; the seventh layer simulated). DTS structures are often used in improving the isolation of integrated devices such as memory cells, thereby reducing the possibility of device latch-up. The DTS simulated consisted of a DARC/ESL, silicon oxide and silicon nitride layers (listed from top-most layer to bottom-most layer). As shown in Table 1, the simulations suggested that the optimal values for the DTS application would be: n=2.15 and k=0.5, to achieve a substrate reflectivity of less than 5%.

A stack incorporating this DARC/ESL will accommodate a ±200 Å variation in silicon oxide layer thickness and a ±75 Å variation in DARC/ESL thickness without affecting substrate reflectivity appreciably. The thickness of the silicon oxide layer and the silicon nitride layer may be varied ±175 Å and ±100 Å, respectively, without experiencing a variation in substrate reflection of more than 3%.

The CES simulated consisted of a DARC/ESL, silicon oxide and silicon nitride layers (listed from top-most layer to bottom-most layer). CES structures are used in applications such as the creation of contacts between a metal layer and a doped well, a guard ring or a polysilicon layer. As also shown in Table 1, the optimal optical values for the CES application were found to be: n=2.15 and k=0.54, to achieve a substrate reflectivity of less than 5%. The preceding n and k values are for a DARC/ESL fabricated according the method of the present invention and tuned for deep UV applications (i.e., radiant energy at a wavelength of 248 nm). This will accommodate a ±250 Å variation in silicon oxide layer thickness and a ±100 Å in DARC/ESL thickness. The thickness of the silicon oxide layer and the silicon nitride layer can vary ±200 Å and ±200 Å, respectively, again without experiencing a variation in substrate reflection of more than 3%.

Along with the previously-noted simplifying assumptions regarding oxide layer composition, a further simplifying assumption was made regarding the simulations of the DTS and CES structures described above. Because they could not be expected to alter the DES's and CES's optical qualities appreciably, the oxide layer normally formed underneath the nitride layer of a DTS (nominally 50 Å in thickness) and a CES (nominally 80 Å in thickness) was not accounted for in the simulations performed. This is believed to be a fair assumption because incident radiant energy of the kind used in photolithography would not, for these stacks, be expected to penetrate the oxide and nitride layers underlying the DARC/ESL in the DTS and CES structures.

The eighth stack simulated consisted of a DARC/ESL, a titanium nitride (TiN) layer and an aluminum layer (again listed from top-most layer to bottom-most layer). This is a good example of a nitride layer which does not contain silicon, the possible use of which was noted previously. Because aluminum is impenetrable to the wavelengths of radiant energy used in photolithographic processes, the composition of layers underlying the aluminum layer is immaterial to this analysis. As noted in Table 1, good results (i.e., minimal substrate reflectivity) was exhibited for a DARC/ESL thickness of 300 Å. Again, a thicker DARC/ESL may be more appropriate for this type of application.

The suggested combinations of DARC/ESL optical properties and thicknesses are capable of yielding substrate reflectivities below 5% in all of the stacks described herein. A DARC/ESL according to the present invention also minimizes substrate reflections and enhances line width accuracy even when the underlying topography and DARC/ESL experience variations in thickness. The simple inclusion of a DARC/ESL fabricated according to the present invention may reasonably be expected to limit substrate reflectivity to less than about 8%, notwithstanding changes in underlying topography. These reflections can exceed 50% when a DARC/ESL is not employed.

The method of the present invention is not intended to be limited by the specific parameters set forth in the above experiments. A person of ordinary skill in the art will realize that different processing conditions and different reactant sources can be used without departing from the spirit of the invention. Other equivalent or alternative methods of depositing a DARC/ESL according to the present invention will be apparent to those skilled in the art. These equivalents and alternatives are intended to be included within the scope of the present invention.

What is claimed is:

1. A process for depositing a multilayer structure over a substrate disposed in processing chamber, comprising the steps of:

forming a first layer over the substrate;

introducing process gases into the processing chamber;

applying energy to said process gases to deposit a second layer over the substrate, said second layer having a material selected from the group consisting of nitride and oxynitride; and maintaining said energy applied to said process gases for a period of time sufficient in length to deposit said second layer to a thickness which enables said second layer to reduce reflection and refraction of incident radiant energy within a photosensitive layer formed over said second layer and which enables said second layer to substantially protect said first layer from exposure to an etchant used to etch a third layer deposited over said second layer.

2. The process of claim 1 wherein:

said second layer reflects a first portion of said incident radiant energy from an upper surface of said second layer and a second portion of said incident radiant energy from a lower surface of said second layer, and said thickness contributes to an ability of said second layer to cause said second portion of said incident radiant energy to be out of phase with said first portion of said incident radiant energy by an odd multiple of about 180°, thereby causing said first portion and said second portion of said incident radiant energy to at least partially cancel.

3. The process of claim 1 wherein said second layer further protects said first layer by virtue of possessing a high etch selectivity with respect to said third layer with respect to said etchant.

4. A process for depositing a multilayer structure over a substrate disposed in a processing chamber, comprising the steps of:

forming a first layer over the substrate;

introducing process gases into the processing chamber;

applying radio-frequency energy to said process gases to create a plasma from said process gases and deposit a second layer over the substrate; and maintaining said energy applied to said process gases for a period of time sufficient in length to deposit said second layer to a thickness which enables said second layer to reduce reflection and refraction of incident radiant energy within a photosensitive layer formed over said second layer and which enables said second layer to substantially protect said first layer from exposure to an etchant used to etch a third layer deposited over said second layer.

5. The process of claim 4 wherein said plasma has a power density of between about 0.8 W/cm$^2$ and 8 W/cm$^2$.

6. The process of claim 4 wherein said process gases comprise a silicon-containing gas an oxygen-containing gas and an inert gas.

7. The process of claim 6 further comprising heating the substrate to a temperature of between about 200° C. and 400° C.

8. A process for depositing a multilayer structure over a substrate disposed in a processing chamber, comprising the steps of:

forming a first layer over the substrate;

introducing process gases comprising silane, nitrous oxide, and helium into the processing chamber;

applying energy to said process gases to deposit a second layer over the substrate; and maintaining said energy applied to said process gases for a period of time sufficient in length to deposit said second layer to a thickness which enables said second layer to reduce reflection and refraction of incident radiant energy within a photosensitive layer formed over said second layer and which enables said second layer to substantially protect said first layer from exposure to an etchant used to etch a third layer deposited over said second layer.

9. The process of claim 8 wherein:

said silane is introduced into the processing chamber at a rate of between about 5 sccm and 300 sccm;

said nitrous oxide is introduced into the processing chamber at a rate of between about 5 sccm and 300 sccm; and said helium is introduced at a rate sufficient to maintain a pressure in the processing chamber of between about 1 torr and 7 torr.

10. The deposition process of claim 9 wherein said rate for introducing the helium is between about 5 sccm and 5000 sccm.

11. The process of claim 8 wherein said process gases further comprise a nitrogen-containing gas.

12. The process of claim 1 wherein the second layer comprises silicon.

13. The process of claim 12 wherein the second layer is a silicon nitride layer.

14. The process of claim 12 wherein the second layer is a silicon oxynitride layer.

15. The process of claim 1 wherein the energy is radio-frequency energy and the energy creates a plasma from the process gases.

16. The process of claim 15 wherein the plasma has a power density of between about 0.8 W/cm$^2$ and 8 W/cm$^2$.

17. The process of claim 1 wherein the process gases comprise a silicon-containing gas, an oxygen-containing gas and an inert gas.

18. The process of claim 17 further comprising heating the substrate to a temperature of between about 200° C. and 400° C.

19. The process of claim 18 wherein the silicon-containing gas is silane, the oxygen-containing gas is nitrous oxide, and the inert gas is helium.

20. The process of claim 19 wherein the silane is introduced into the processing chamber at a rate of between about 5 sccm and 300 sccm, the nitrous oxide is introduced into the processing chamber at a rate of between about 5 sccm and 300 sccm, and the helium is introduced at a rate sufficient to maintain a pressure in the processing chamber of between about 1 torr and 7 torr.

21. The process of claim 20 wherein the rate of introducing the helium is between about 5 sccm and 5000 sccm.

22. The process of claim 17 wherein the process gases further comprise a nitrogen-containing gas.

* * * * *